United States Patent [19]

Sogo

[11] 4,161,430

[45] Jul. 17, 1979

[54] METHOD OF FORMING INTEGRATED CIRCUIT METAL INTERCONNECT STRUCTURE EMPLOYING MOLYBDENUM ON ALUMINUM

[75] Inventor: Marilyn R. Sogo, San Diego, Calif.

[73] Assignee: Burroughs Corporation, Detroit, Mich.

[21] Appl. No.: 966,325

[22] Filed: Dec. 4, 1978

[51] Int. Cl.$^2$ .................... C25D 5/02; H01L 23/48
[52] U.S. Cl. .................................... 204/15; 357/71
[58] Field of Search ............... 204/15, 42; 357/71; 29/577 R

[56] References Cited

U.S. PATENT DOCUMENTS

| | | | |
|---|---|---|---|
| 3,741,880 | 6/1973 | Shiba et al. | 204/15 |
| 3,864,217 | 2/1975 | Takahata et al. | 204/15 |
| 3,939,047 | 2/1976 | Tsunemitsu | 204/15 |
| 4,045,302 | 8/1977 | Gibb et al. | 204/15 |

Primary Examiner—T. M. Tufariello
Attorney, Agent, or Firm—Mervyn L. Young; Kevin R. Peterson

[57] ABSTRACT

A method for forming an aluminum interconnect structure on an integrated circuit chip which method employs the anodization of the aluminum but eliminates the necessity for the formation of a hard anodic barrier on the aluminum. Furthermore, the technique provides a superior "cold via" contact. A layer of molybdenum is deposited over the aluminum conductive layer which molybdenum layer is not as wide as the desired interconnect structure and then covered with a dielectric which is patterned to the same width as the desired interconnect structure so as to protect the molybdenum from attack by an electrolyte. Anodization can then be performed to achieve the interconnect structure and a via is etched in the dielectric.

10 Claims, 4 Drawing Figures

METHOD OF FORMING INTEGRATED CIRCUIT METAL INTERCONNECT STRUCTURE EMPLOYING MOLYBDENUM ON ALUMINUM

BACKGROUND OF THE INVENTION

1. Field of Invention

This invention relates to a method of forming a metal interconnect structure for integrated circuits and more particularly to such a method wherein the interconnect structure is formed with molybdenum on aluminum.

2. Description of the Prior Art

In the formation of integrated circuit chips, the electrical interconnections between the various elements on the wafer can be formed by depositing aluminum over the respective chips and then anodizing the aluminum in a particular pattern so as to form the respective conductor circuits between the elements. In the anodization process, a barrier layer of aluminum oxide is formed over the aluminum and a photoresist pattern is then formed over the barrier layer utilizing standard photolithographic techniques. The barrier layer prevents the formation of hillocks in the aluminum during later processing. The barrier layer is then etched away in those areas where there is no photoresist pattern, and those portions of the aluminum layer thus exposed are then subsequently anodized to form the insulating areas that define the conductive circuit patterns. Such prior art techniques are disclosed, for example, in the Gibbs et al U.S. Pat. No. 4,045,302.

Memory cells for electrically alterable read-only memories may be formed on top of the integrated circuit structure, which cells are formed of amorphous semiconductor materials which are capable of being switched to and from a low resistance crystalline state. The particular type of memory switching amorphous semiconductor material is the tellurium based chalcogenide class of materials. Such an amorphous memory device is described, for example, in the Bluhm U.S. Pat. No. 4,115,872.

A particular problem in making electrical contact with such an amorphous material is that it will interdiffuse with the aluminum conductive material during the fabrication, or during the electrical write operation after the device has been fabricated. Thus, in the prior art fabrication of such devices, a refractory material must first be placed over the conductor at those positions where contact is to be made. This requires additional lithographic and other processing steps which increase the time and cost of fabrication.

It is then, an object of the present invention to provide an improved method of making a conductor structure.

It is another object of the present invention to provide an improved method of making an electrical conductor structure for employment with integrated circuit chips.

It is still a further object of the present invention to provide an improved method of making a conductor structure that can make electrical contact with amorphous semiconductor materials.

SUMMARY OF THE INVENTION

The above identified and other objects of the present invention are obtained by depositing a layer of molybdenum over the aluminum conductive layer which molybdenum layer is not as wide as the desired interconnect structure and in covering the molybdenum layer with a dielectric which is patterned to the same width as the desired interconnect structure so as to protect the molybdenum from attack by an electrolyte. Anodization can then be performed to achieve the interconnect structure and a via is etched in the dielectric. This method eliminates the necessity for the formation of a hard anodic barrier on the aluminum. Furthermore, the technique provides a superior "cold via" contact.

A feature, then, of the present invention resides in depositing a layer of molybdenum over an aluminum layer to a width less than the desired aluminum contact width and placing a dielectric layer over the molybdenum layer to the width desired for the interconnect structure and then anodizing the exposed aluminum.

DESCRIPTION OF THE DRAWINGS

The above and other objects, advantages and features of the present invention will become more readily apparent from a review of the following specification when taken in conjunction with the drawings wherein.

GENERAL DESCRIPTION OF THE INVENTION

Figure 1:
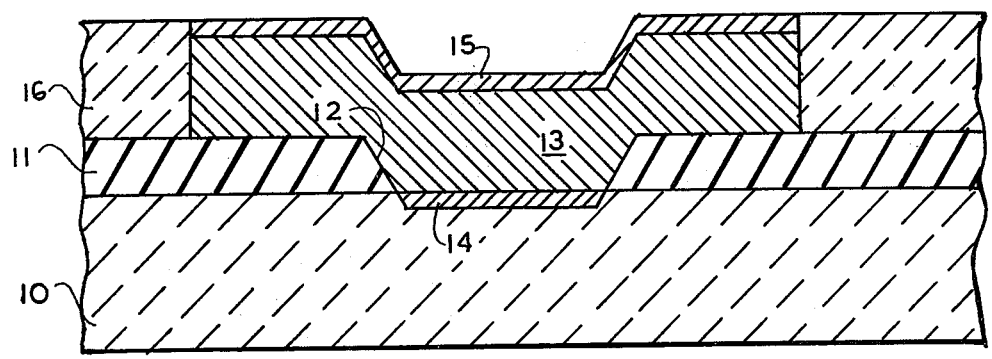
FIGS. 1 and 2 are cross-sectional views of electrical contacts as employed in the prior art.

In order to illustrate the differences between the present invention and the prior art, a typical prior art embodiment will now be described in relation to FIG. 1. As shown therein, an insulative layer 11 which may be silicon dioxide is formed on the surface of semiconductor substrate 10 and via 12 is opened in layer 11 for subsequent electrical contact with substrate 10. Substrate 10 may have various active devices formed therein. Aluminum interconnect layer 13 is then deposited over insulative layer 11 and via 12 where it forms an aluminum-silicon alloyed Schottky diode 14 with the silicon substrate 10. This could also be an ohmic contact to other silicon regions on the wafer depending on the dopant concentration in the silicon under via 12. The entire conductive layer 13 is then subjected to a hard anodization to form a dense aluminum oxide layer 15 of approximately 1000 angstroms in thickness. Prior to this hard anodization, aluminum layer 13 may be subjected to a soft anodization to form a thin porous oxide layer (not shown) for resist adhesion. Hard barrier layer 15 is provided in order to prevent the formation of hillocks that can cause short circuits with other connectors placed over aluminum connect 13. A photoresist pattern is then formed over areas of the wafer wherever a metal pattern is desired. Hard barrier layer 15 is then etched away in the areas where there is no photoresist pattern. The exposed portions of aluminum layer 13 are then provided with a soft anodization to create porous aluminum oxide regions 16 where the aluminum interconnect is not desired. After the photoresist layer is removed, the structure thus formed is then ready for the deposition of a second dielectric layer and so forth. In addition to the suppression of hillocks during subsequent high temperature processing, or high current densities, hard anodic oxide layer 15, further serves to prevent anodization of the aluminum conductors thereunder.

As was indicated above, a problem is encountered when the device is being fabricated to employ amorphous semiconductor materials such as might be employed in erasable read-only memories. Cells formed of such materials require electrical contacts with both the bottom and upper surfaces. Therefore, in the fabrication of a memory array of such cells, the cells are normally formed on top of a silicon substrate which has first been supplied with the conductive leads. The problem encountered is that such amorphous semiconductor materials interdiffuse with the metal and thus degrade device performance. Therefore, it is necessary to place a refractory metal between the amorphous cell and the underlying as well as the overlaying aluminum connectors. It has been discovered that refractory metals such as tantalum are particularly applicable for such a purpose. With the use of such a refractory metal on top of the aluminum connector, it is not necessary to provide the hard anodization barrier layer as the tantalum serves to suppress hillock formation whenever the wafer and corresponding circuitry is subjected to high temperatures or the aluminum metal is subjected to high current densities. Other refractory metals and alloys which form electrically isolating oxides are hafnium and niobium.

The employment of these particularly refractory metals and alloys serve to eliminate two anodization steps in the formation of a metal interconnect structure on an integrated circuit chip thereby reducing the time and cost of manufacturing such circuits.

Figure 2:
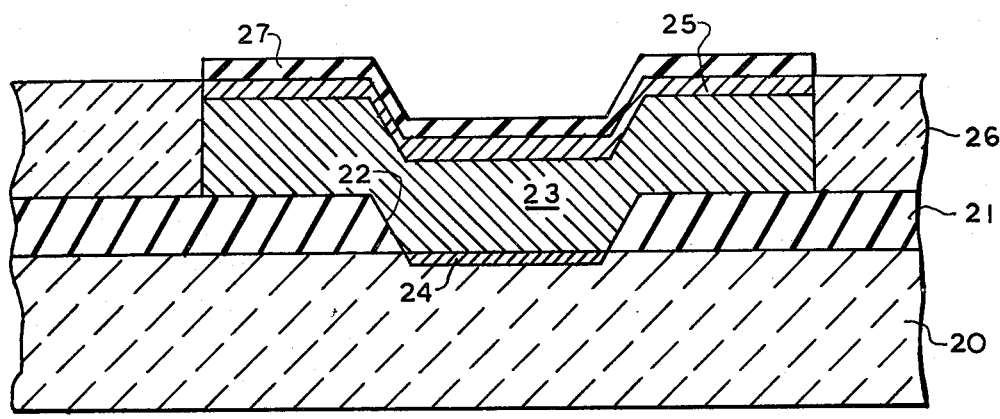

Another example of the prior art which is designed to overcome the above-described problems is illustrated in FIG. 2 and disclosed in the Holmberg application Ser. No. 919,277, filed June 26, 1978. After silicon dioxide layer 21 has been deposited on silicon substrate 20, via 22 is opened and aluminum layer 23 is deposited to form an aluminum-silicon alloy layer 24 with the silicon substrate. Aluminum layer 23 is approximately 1 micrometer thick. Tantalum layer 25 is then deposited over the aluminum to the thickness of approximately 1000 angstroms. Silicon dioxide layer 27 is then deposited over tantalum layer 25. A photoresist pattern is then formed over the silicon dioxide wherever the metal conductors are desired and the wafers then subjected to a carbon tetrafluoride plasma with approximately 4 percent oxygen to remove the silicon dioxide and tantalum from areas wherever soft anodization is to be carried out, thereby exposing portions of aluminum layer 23. The exposed aluminum surface is then anodized in a phosphoric, sulfuric or other solution to convert that exposed aluminum to aluminum oxide layer 26 down to the surface of silicon dioxide layer 21. The photoresist material is then removed and the wafer is then ready for the deposition of a second dielectric layer to receive another conductor and so forth.

In addition to tantalum, molybdenum is also a suitable barrier metal for employment with amorphous devices. In addition, molybdenum forms a superior "cold via" contact with aluminum as compared to normal aluminum interconnect structures. That is to say, a metal to molybdenum contact provides better electrical contact without an extra heat treatment step in the fabrication process than do other metal to aluminum contacts. Furthermore, molybdenum provides a good amorphous semiconductor contact. However, molybdenum is readily attacked by those electrolytes normally employed in the aluminum anodization. To this end, the present invention is designed to allow the employment of molybdenum and yet to protect molybdenum from such attack.

Figure 3:
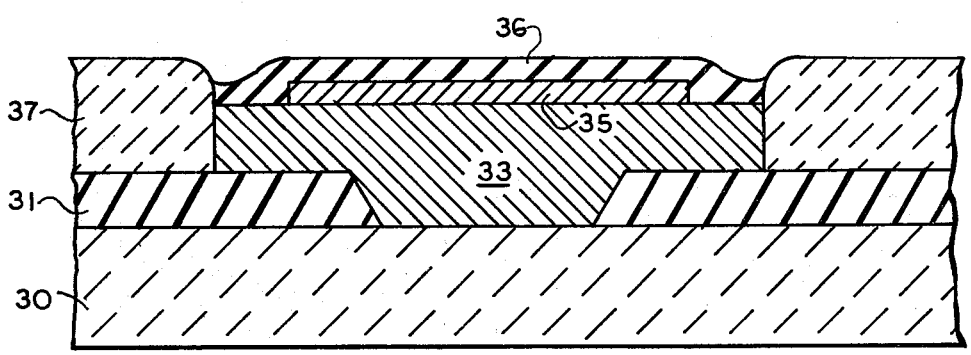
FIGS. 3 and 4 are cross-sectional views illustrating the method of the present invention.

As indicated in FIG. 3, aluminum layer 33 is deposited over silicon dioxide layer 31 on silicon substrate 30 so as to cover via 32 and make contact with silicon substrate 30. Aluminum layer 33 may be pure aluminum or alloys thereof such as aluminum-copper, aluminum-silicon or aluminum-copper-silicon, such alloys being employed for hillock control. Aluminum layer 33 is approximately 1 micrometer thick. A layer of molybdenum of approximately 0.1 micrometer in thickness is then deposited over the aluminum and is patterned by photoresist to define the interconnect structure. The unwanted molybdenum is then etched either by a chemical process or by carbon tetraflouride plasma. The pattern is such as to be smaller than the pattern of the aluminum conductor to be formed. A thin film 36 of silicon dioxide is then chemically vapor deposited over the molybdenum layer 35 to a thickness of 0.1–0.2 micormeter. Silicon dioxide layer 36 is then photoresist patterned and etched to be of the same size as desired for the completed aluminum conductor. Silicon dioxide 36 is to serve as anodizing mask and protect the molybdenum from attack. In this manner, the edges of the molybdenum will not be exposed to the anodizing electrolyte. The exposed aluminum is then anodized as in an oxolic acid or other similar acids so as to form porous anodic aluminum portions 37 which will "grow" above the level of the remaining portions of the aluminum layer 33.

Figure 4:
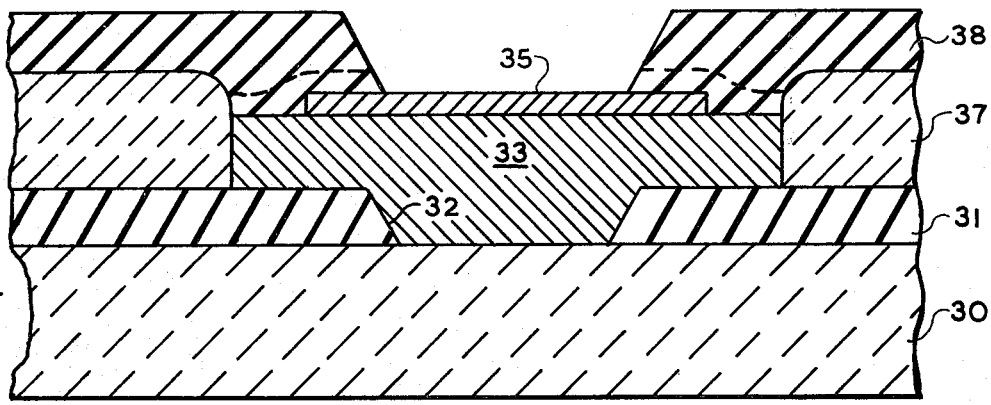

As indicated in FIG. 4, a subsequent silicon dioxide layer is deposited over the structure and the via opened to receive the next interconnect layer.

EPILOGUE

A method has been disclosed for forming an aluminum interconnect structure on an integrated circuit chip which method employs the anodization of the aluminum but eliminates the necessity for the formation of a hard anodic barrier on the aluminum. Furthermore, the technique provides a superior "cold via" contact, including electrical contact with amorphous semiconductor materials.

Although only one embodiment of the present invention has been disclosed, and it will be apparent to those skilled in the art that variations and modifications may be made therein without departing from the spirit and scope of the invention as claimed.

What is claimed is:

1. A method of forming an interconnect structure on a semiconductor substrate, said method comprising:
   depositing an aluminum layer on said substrate;
   depositing a layer of molybdenum on said aluminum layer;
   forming a photoresist pattern defining an interconnect structure having a width more narrow than the desired width of the interconnect structure;
   etching portions of said molybdenum layer exposed by a said photoresist pattern;
   removing said photoresist pattern;
   depositing a first dielectric layer over said molybdenum pattern with a width greater than the width of said molybdenum pattern so as to completely cover said molybdenum pattern; and
   anodizing said exposed aluminum layer to form said interconnect structure.

2. The method according to claim 1 which further includes the steps of:
   depositing a second dielectric layer over said anodized aluminum and said first dielectric pattern defining said interconnect pattern; and
   opening vias in said dielectric layers where interconnection is desired.

3. The method according to claim 1 wherein:

said anodization is performed in a solution of oxalic acid.
4. The method according to claim 1 wherein: said molybdenum pattern is etched in a carbon tetriflouride plasma.
5. The method according to claim 1 wherein: said aluminum layer is formed of aluminum and copper.
6. The method according to claim 1 wherein: said aluminum layer is formed of aluminum and silicon.
7. The method according to claim 1 wherein: said aluminum layer is formed of aluminum, silicon and copper.
8. A method of forming an interconnect structure on a semiconductor substrate, said method comprising:

depositing a dielectric layer on said substrate and opening vias therein;

depositing an aluminum layer on said dielectric layer and said vias;

depositing a layer of molybdenum on said aluminum layer; forming a photoresist pattern defining an interconnect structure having a width more narrow than the deisred width of the interconnect structure;

etching portions of said molybdenum layer exposed by a said photoresist pattern;

removing said photoresist pattern;

depositing a first dielectric layer over said molybdenum pattern with a width greater than the width of said molybdenum pattern so as to completely cover said molybdenum pattern; and anodizing said exposed aluminum layer to form said interconnect structure.

9. The method according to claim 8 wherein: said aluminum layer is formed of aluminum and copper.

10. The method according to claim 8 wherein: said aluminum layer is formed of aluminum and silicon.

* * * * *